US012589822B2

(12) United States Patent
Pallure et al.

(10) Patent No.: US 12,589,822 B2
(45) Date of Patent: Mar. 31, 2026

(54) IN-FRAME MOUNTED BICYCLE DISPLAY

(71) Applicant: SPECIALIZED BICYCLE COMPONENTS, INC., Morgan Hill, CA (US)

(72) Inventors: Marc Pallure, Zug (CH); Jose Daniel Rueda Cabello, Adliswil (CH); Rudy Megevand, Oberageri (CH); Marco Werner Sonderegger, Benzenschwil (CH); Fabian Schlageter, Bremgarten (CH)

(73) Assignee: SPECIALIZED BICYCLE COMPONENTS, INC., Morgan Hill, CA (US)

( * ) Notice: Subject to any disclaimer, the term of this patent is extended or adjusted under 35 U.S.C. 154(b) by 832 days.

(21) Appl. No.: 17/746,846

(22) Filed: May 17, 2022

(65) Prior Publication Data

US 2022/0379990 A1 Dec. 1, 2022

Related U.S. Application Data

(60) Provisional application No. 63/192,988, filed on May 25, 2021.

(51) Int. Cl.
B62J 50/21 (2020.01)
B62K 19/40 (2006.01)
H05K 5/00 (2006.01)

(52) U.S. Cl.
CPC ............. B62J 50/225 (2020.02); B62K 19/40 (2013.01); H05K 5/0017 (2013.01)

(58) Field of Classification Search
CPC .......... B62J 50/225; B62J 50/22; B62J 43/28; B62K 19/40; H05K 5/0017
(Continued)

(56) References Cited

U.S. PATENT DOCUMENTS 2,596,438 A * 5/1952 Rollings ................. E05D 15/00
160/369
5,178,033 A 1/1993 Kund
(Continued)

FOREIGN PATENT DOCUMENTS

CH 714097 B1 3/2019
CN 205220948 U * 5/2016
(Continued)

OTHER PUBLICATIONS

Barth; original document with English translation (DE 4427173) (Year: 2025).*

(Continued)

*Primary Examiner* — John Olszewski
*Assistant Examiner* — Nathaniel William Watkins
(74) *Attorney, Agent, or Firm* — KNOBBE, MARTENS, OLSON & BEAR, LLP

(57) ABSTRACT

A removable display assembly for a bicycle includes: a housing having a body that extends along a first direction from a first end to a second end, wherein the body further extends along a second direction that is transverse to the first direction, such that at least a portion of the body can be positioned through an opening in a wall of a first tube of a bicycle frame to be at least partially positioned within an internal cavity of the first tube, wherein the opening extends along the first direction from a first end to a second end, a display coupled to the body of the housing; a first transverse spring coupled to the first end of the housing; a second transverse spring coupled to the second end of the housing; and a third spring coupled to the second end of the housing.

26 Claims, 5 Drawing Sheets

(58) Field of Classification Search
USPC .................................................... 280/288.4
See application file for complete search history.

(56) References Cited

U.S. PATENT DOCUMENTS

| | | | |
|---|---|---|---|
| 5,798,702 | A | 8/1998 | Okamoto et al. |
| 6,305,241 | B1 | 10/2001 | Masui |
| D472,834 | S | 4/2003 | Ueda |
| D499,973 | S | 12/2004 | Okuda |
| D499,974 | S | 12/2004 | Okuda |
| D522,394 | S | 6/2006 | Okuda |
| 7,165,641 | B2 | 1/2007 | Kitamura |
| D553,528 | S | 10/2007 | Ueda |
| D554,014 | S | 10/2007 | Ueda |
| 7,393,125 | B1 | 7/2008 | Lai |
| D637,508 | S | 5/2011 | Ueda |
| D640,608 | S | 6/2011 | Funabiki |
| D645,371 | S | 9/2011 | Ueda |
| D665,685 | S | 8/2012 | Okuda |
| 8,305,742 | B2 | 11/2012 | Onnela et al. |
| D674,322 | S | 1/2013 | Hilgart |
| 8,364,389 | B2 | 1/2013 | Dorogusker et al. |
| D680,890 | S | 4/2013 | Ueda |
| 8,531,072 | B2 | 9/2013 | Wishart |
| D704,583 | S | 5/2014 | Ueda |
| D711,755 | S | 8/2014 | Oasbach |
| D727,768 | S | 4/2015 | Nagano |
| D743,824 | S | 11/2015 | Lumme |
| 9,194,955 | B1 | 11/2015 | Fahrner et al. |
| D759,522 | S | 6/2016 | Ueda |
| 9,359,036 | B2 | 6/2016 | Thompson |
| D772,746 | S | 11/2016 | Henne |
| D777,591 | S | 1/2017 | Haapakoski |
| 9,580,140 | B2 | 2/2017 | Talavasek et al. |
| 9,851,753 | B2 | 12/2017 | Gao et al. |
| D810,733 | S | 2/2018 | Kwak |
| 10,086,708 | B2 | 10/2018 | Ichida et al. |
| 10,093,379 | B2 | 10/2018 | Hines et al. |
| 10,279,212 | B2 | 5/2019 | Dalebout et al. |
| D852,677 | S | 7/2019 | Callahan |
| 10,472,013 | B2 | 11/2019 | Pelot et al. |
| 10,472,015 | B1 * | 11/2019 | Sonderegger ............ B62J 43/30 |
| 10,479,440 | B2 | 11/2019 | Kishita |
| D891,991 | S | 8/2020 | Sonderegger et al. |
| 10,812,645 | B2 | 10/2020 | Montez et al. |
| 10,858,061 | B2 | 12/2020 | Montez et al. |
| 10,868,398 | B2 | 12/2020 | Ma |
| 10,933,936 | B2 | 3/2021 | Sonderegger et al. |
| 11,254,386 | B2 | 2/2022 | Isenschmid et al. |
| 11,623,710 | B2 | 4/2023 | Pienaar |
| 11,820,456 | B2 | 11/2023 | Sonderegger et al. |
| 2002/0189348 | A1 * | 12/2002 | Badiali .................. H05K 5/061 |
| | | | 73/431 |
| 2007/0052100 | A1 * | 3/2007 | Bellinger ............. H01R 13/508 |
| | | | 257/727 |
| 2008/0252038 | A1 | 10/2008 | Blomme et al. |
| 2009/0091292 | A1 | 4/2009 | Nippear et al. |
| 2009/0170660 | A1 | 7/2009 | Miglioranza |
| 2010/0188250 | A1 | 7/2010 | Kim et al. |
| 2012/0049483 | A1 | 3/2012 | Dodman et al. |
| 2012/0083956 | A1 | 4/2012 | Aok et al. |
| 2012/0313344 | A1 | 12/2012 | Dal Pozzo |
| 2013/0087665 | A1 * | 4/2013 | Lostoski .............. H05K 5/0204 |
| | | | 248/65 |
| 2015/0180517 | A1 | 6/2015 | Abe et al. |
| 2016/0039496 | A1 | 2/2016 | Hancock et al. |
| 2017/0043829 | A1 | 2/2017 | Li |
| 2017/0046552 | A1 | 2/2017 | Li |
| 2017/0134063 | A1 | 5/2017 | Lee et al. |
| 2017/0327173 | A1 | 11/2017 | Cooper |
| 2017/0334522 | A1 | 11/2017 | Zahid et al. |
| 2018/0029658 | A1 | 2/2018 | Boundy |
| 2018/0268668 | A1 | 9/2018 | Tetsuka |
| 2018/0281896 | A1 | 10/2018 | Takeshita et al. |
| 2019/0002053 | A1 | 1/2019 | Kakinoki |
| 2019/0009780 | A1 | 1/2019 | Komatsu |
| 2019/0287442 | A1 | 9/2019 | Wang et al. |
| 2019/0337588 | A1 | 11/2019 | Wecker et al. |
| 2020/0062329 | A1 * | 2/2020 | Talavasek ................ B62J 43/13 |
| 2020/0207435 | A1 | 7/2020 | Salvioli Mariani et al. |
| 2020/0346706 | A1 | 11/2020 | Isenschmid et al. |
| 2021/0039737 | A1 | 2/2021 | Montez et al. |
| 2021/0155315 | A1 | 5/2021 | Hahn et al. |
| 2021/0237820 | A1 | 8/2021 | Carlier |
| 2021/0291923 | A1 | 9/2021 | Sonderegger et al. |
| 2022/0242515 | A1 | 8/2022 | Uda et al. |
| 2023/0002004 | A1 | 1/2023 | De La Serna Gonzalez et al. |
| 2023/0034449 | A1 | 2/2023 | Fujii et al. |

FOREIGN PATENT DOCUMENTS

| | | | | |
|---|---|---|---|---|
| CN | 205872330 | | 1/2017 | |
| CN | 106379472 | | 2/2017 | |
| CN | 104908864 | | 9/2017 | |
| CN | 109501920 | | 3/2019 | |
| CN | 108749974 | | 8/2020 | |
| CN | 212766602 | | 3/2021 | |
| CN | 109018147 | | 6/2021 | |
| CN | 106428377 | | 3/2022 | |
| CN | 216332505 | | 4/2022 | |
| CN | 216508802 | | 5/2022 | |
| DE | 9204615 | U1 | 4/1992 | |
| DE | 4105505 | A1 * | 9/1992 | ......... G02F 1/13452 |
| DE | 202013103030 | U1 | 10/2013 | |
| DE | 202015002905 | | 5/2015 | |
| DE | 10 2021 120 276 | | 8/2022 | |
| DE | 20 2023 103 043 | | 8/2023 | |
| DE | 10 2022 106 780 | | 9/2023 | |
| DE | 10 2022 206 633 | | 1/2024 | |
| EP | 3281855 | | 2/2018 | |
| EP | 3296190 | | 3/2018 | |
| EP | 3428051 | | 1/2019 | |
| EP | 3587236 | | 1/2020 | |
| EP | 3845442 | | 7/2021 | |
| EP | 3851365 | | 7/2021 | |
| EP | 4095024 | A1 | 11/2022 | |
| FR | 730602 | A | 8/1932 | |
| JP | H08-268361 | | 10/1996 | |
| JP | 2003116226 | | 4/2003 | |
| KR | 10-2021-0111267 | | 9/2021 | |
| KR | 10-2021-0143480 | | 11/2021 | |
| WO | WO 2019/043576 | A1 | 3/2019 | |
| WO | WO 2020/146038 | | 7/2020 | |
| WO | WO 2022/167372 | | 8/2022 | |
| WO | WO 2023/025903 | | 3/2023 | |
| WO | WO 2023/202861 | | 10/2023 | |
| WO | WO 2024/009167 | | 1/2024 | |

OTHER PUBLICATIONS

Amazon, ArcEnCiel Water Resistant Front Top Tube Pannier Bike Frame Storage Bag Mobile Phone Holder < 5.7" Screen, https://www.amazon.com/ArcEnCiel-Resistant-Pannier-Storage-Mobile/dp/B01ALIEWBS, accessed on Apr. 12, 2018, in 2 pages.
BESV JS1 Features, http://www.besv.com/products/js1 , accessed on Apr. 16, 2018, in 8 pages.
BikeRadar, Trail Tech: Garmin Mounts for Mountain Bikers, https://www.bikeradar.com/us/mtb/gear/article/trail-tech-garmin-mounts-for-mountain-bikers-40528 , dated Mar. 26, 2014, in 6 pages.
EBIKE24, E-Bike Blog, Forestal Siryon: I come from the woods, Jan. 28, 2021, available at https://www.ebike24.com/blog/enduro-e-bike-forestal-siryon, accessed on Aug. 2, 2022, in 12 pages.
Stromer, Operating Manual, Version 3.0, dated Dec. 2016, in 38 pages.
EBAY, Stromer Electric Bike Omni C Control Panel Display, available at https://www.ebay.com/itm/224829222886, accessed on Aug. 2, 2022, in 7 pages.
YouTube, KT-LCD3 Display is a Must Have accessory for the Sondors Ebike, https://www.youtube.com/watch?v=dE3WcpC5I-WE , accessed on Apr. 12, 2018, in 1 page.

(56) References Cited

OTHER PUBLICATIONS

Orbea Blue Papers Gain Technical Manual, dated Feb. 2018 (Applicant reserves right to challenge date of public availability), in 34 pages.

Shimano Alfine S7051 Series Dealer's Manual, dated Apr. 2018 (Applicant reserves right to challenge date of public availability), in 89 pages.

\* cited by examiner

C — Transverse/Vertical Axis
A — Longitudinal/Horizontal Axis
B — Lateral Axis

IN-FRAME MOUNTED BICYCLE DISPLAY

TECHNICAL FIELD

The present technology relates to bicycles and, in particular, bicycles with electronic displays.

DESCRIPTION OF RELATED TECHNOLOGY

Electric bicycles generally include human machine interfaces for interacting with the electric bicycles. The human machine interfaces can enable operators to monitor the electric bicycles.

SUMMARY

The systems, methods and devices described herein have innovative aspects, no single one of which is indispensable or solely responsible for their desirable attributes. Without limiting the scope of the claims, some of the advantageous features will now be summarized.

The present disclosure presents various embodiments of systems, devices, and methods for removably mounting an electronic device, a display assembly, a controller, and/or the like within a cavity of a bicycle tube, such as a top tube of an electric bicycle. In some embodiments, the system comprises a plurality of springs configured to constrain a display assembly with respect to a top tube along a plurality of directions.

According to some embodiments, a bicycle comprises: a frame having a plurality of tubes including at least a first tube, the first tube comprising a wall that defines an internal cavity, the first tube further comprising an opening, with a portion of the wall surrounding the opening, the opening extending along a first direction (such as a longitudinal direction) from a first end to a second end; and a display assembly removably mounted to the first tube, the display assembly comprising: a housing comprising a body that extends along the first direction from a first end to a second end, wherein the body further extends through the opening of the first tube along a second direction that is transverse to an exterior surface of the portion of the wall that surrounds the opening, the body at least partially positioned within the internal cavity of the first tube, the housing further comprising a lip positioned over the exterior surface; a display coupled to the body of the housing such that at least a portion of the display is visible external to the first tube; a first transverse spring coupled to the first end of the housing; a second transverse spring coupled to the second end of the housing; and a third spring (such as a longitudinal spring) coupled to the second end of the housing, wherein the first transverse spring and the second transverse spring are each compressed against an interior surface of the portion of the wall that surrounds the opening to generate a transverse biasing force along the second direction that biases the lip toward the exterior surface, and wherein the third spring is compressed against a portion of the first tube to generate a biasing force along the first direction (such as a longitudinal biasing force) that biases the housing toward the first end of the opening.

In some embodiments, the first tube is a top tube. In some embodiments, the longitudinal spring is compressed against the second end of the opening. In some embodiments, the third spring comprises a lip positioned in contact with the exterior surface of the portion of the wall that surrounds the opening. In some embodiments, the lip of the housing extends along the first direction a sufficient distance to cover a gap between the second end of the opening and the second end of the body of the housing with the housing abutting the first end of the opening. In some embodiments, the third spring comprises sheet metal. In some embodiments, the first transverse spring and the second transverse spring each comprise sheet metal. In some embodiments, the first transverse spring, the second transverse spring, and the third spring are each coupled to the housing using one or more fasteners. In some embodiments, at least one of the one or more fasteners is used to couple both the second transverse spring and the third spring to the housing. In some embodiments, the opening comprises a length along the first direction that is at least 105% of a length of the body of the housing along the first direction. In some embodiments, no fasteners are used to mount the display assembly to the first tube. In some embodiments, at least a portion of the housing forms an interference fit with the opening along a third direction (such as a lateral direction). In some embodiments, the at least a portion of the housing that forms an interference fit with the opening along the third direction comprises a compressible material.

According to some embodiments, a removable display assembly for a bicycle comprises: a housing comprising a body that extends along a first direction (such as a longitudinal direction) from a first end to a second end, wherein the body further extends along a second direction (such as a vertical direction), such that at least a portion of the body can be positioned through an opening in a wall of a first tube of a bicycle frame to be at least partially positioned within an internal cavity of the first tube, the housing further comprising a lip configured to extend at least partially over an exterior surface of the wall of the first tube; a display coupled to the body of the housing such that at least a portion of the display will be visible external to the first tube when the at least a portion of the body is at least partially positioned within the internal cavity of the first tube; a first spring (such as a first vertical spring) coupled to the first end of the housing; a second spring (such as a second vertical spring) coupled to the second end of the housing; and a third spring (such as a longitudinal spring) coupled to the second end of the housing, wherein the first spring and the second spring are each configured to be compressed against an interior surface of the wall to generate a biasing force that biases the lip along the second direction toward the exterior surface of the wall, and wherein the longitudinal spring is configured to be compressed against a portion of the first tube to generate a biasing force that biases the housing along the first direction toward a first end of the opening.

In some embodiments, the third spring is configured to be compressed against a second end of the opening. In some embodiments, the third spring comprises a lip configured to be positioned in contact with the exterior surface of the wall. In some embodiments, the first spring, the second spring, and the third spring each comprise sheet metal. In some embodiments, at least a portion of the housing comprises a compressible material configured to form an interference fit with the opening along a third direction that is perpendicular to both the first direction and the second direction (such as a lateral direction). In some embodiments, the removable display assembly further comprises: a bicycle frame having a plurality of tubes including at least the first tube, wherein the at least a portion of the body is positioned through the opening in the wall of the first tube of the bicycle frame to be at least partially positioned within the internal cavity of the first tube. In some embodiments, the lip of the housing extends along the first direction a sufficient distance to cover a gap between a second end of the opening and the body of the housing with the housing abutting the first end of the opening. In some embodiments, the opening comprises a length along the first direction that is at least 105% of a length along the first direction of the body of the housing. In some embodiments, no fasteners are used to mount the display assembly to the first tube.

According to some embodiments, a bicycle comprises: a frame having a plurality of tubes including at least a first tube, the first tube comprising a wall that defines an internal cavity, the wall comprising an opening that extends along a first direction (such as a longitudinal direction) from a first end to a second end; and a display assembly removably mounted to the first tube, the display assembly comprising: a housing comprising a body that extends along the first direction from a first end to a second end, wherein the body further extends along a second direction (such as a vertical direction) through the opening of the first tube and is at least partially positioned within the internal cavity of the first tube, the housing further comprising a lip directly or indirectly engaged with the exterior surface of the wall; a display coupled to the body of the housing such that at least a portion of the display is visible external to the first tube; a first spring (such as a first vertical spring) coupled to the first end of the housing; a second spring (such as a second vertical spring) coupled to the second end of the housing; and a third spring (such as a longitudinal spring) coupled to the second end of the housing, wherein the first spring and the second spring are each compressed against an interior surface of the wall to generate a biasing force along the second direction that biases the lip toward the exterior surface of the wall, and wherein the third spring is compressed against a portion of the first tube to generate a biasing force along the first direction that biases the housing toward the first end of the opening.

In some embodiments, the lip is directly engaged with the exterior surface of the wall through contact between the lip and the exterior surface of the wall. In some embodiments, the lip is indirectly engaged with the exterior surface of the wall through a gasket. In some embodiments, the third spring is compressed against the second end of the opening, and wherein the third spring comprises a lip positioned in contact with the exterior surface of the wall. In some embodiments, the first spring, the second spring, and the third spring each comprises sheet metal.

According to some embodiments, a removable display assembly for a bicycle comprises: a housing comprising a body that extends along a first direction (such as a longitudinal direction) from a first end to a second end, wherein the body further extends along a second direction that is transverse to the first direction, such that at least a portion of the body can be positioned through an opening in a wall of a first tube of a bicycle frame to be at least partially positioned within an internal cavity of the first tube, wherein the opening extends along the first direction from a first end to a second end, the housing further comprising a lip configured to extend at least partially over an exterior surface of a portion of the wall that surrounds the opening; a display coupled to the body of the housing such that at least a portion of the display will be visible external to the first tube when the at least a portion of the body is positioned through the opening; a first transverse spring coupled to the first end of the housing; a second transverse spring coupled to the second end of the housing; and a third spring (such as a longitudinal spring) coupled to the second end of the housing, wherein the first transverse spring and the second transverse spring are each configured to be compressed against an interior surface of the portion of the wall that surrounds the opening to generate a transverse biasing force along the second direction that biases the lip toward the exterior surface, and wherein the third spring is configured to be compressed against a portion of the first tube to generate a biasing force that biases the housing along the first direction toward the first end of the opening.

In some embodiments, the removable display assembly further comprises: the bicycle frame, wherein the bicycle frame comprises a plurality of tubes including at least the first tube, wherein the at least a portion of the body is positioned through the opening in the wall of the first tube of the bicycle frame to be at least partially positioned within the internal cavity of the first tube. In some embodiments, the first tube is a top tube. In some embodiments, the third spring is configured to be compressed against the second end of the opening. In some embodiments, the third spring comprises a lip positioned to be in contact with the exterior surface of the portion of the wall that surrounds the opening. In some embodiments, the lip of the housing extends along the first direction a sufficient distance to cover a gap between the second end of the opening and the second end of the body of the housing with the housing abutting the first end of the opening. In some embodiments, the third spring, the first transverse spring, and the second transverse spring each comprises sheet metal. In some embodiments, the first transverse spring, the second transverse spring, and the third spring are each coupled to the housing using one or more fasteners. In some embodiments, at least one of the one or more fasteners is used to couple both the second transverse spring and the third spring to the housing. In some embodiments, the opening comprises a length along the first direction that is at least 105% of a length along the first direction of the body of the housing. In some embodiments, no fasteners are used to mount the display assembly to the first tube. In some embodiments, at least a portion of the housing forms an interference fit with the opening along a third direction that is perpendicular to both the first direction and the second direction (such as a lateral direction). In some embodiments, the at least a portion of the housing that forms an interference fit with the opening along the third direction comprises a compressible material.

According to some embodiments, a method of removably mounting a display assembly to a bicycle frame comprises: providing a bicycle frame having a plurality of tubes including at least a first tube, the first tube comprising a wall that defines an internal cavity, the wall comprising an opening that extends along a first direction (such as a longitudinal direction) from a first end to a second end; providing a display assembly, the display assembly comprising: a housing comprising a body that extends along the first direction from a first end to a second end; a display coupled to the body of the housing; a first transverse spring coupled to the first end of the housing; a second transverse spring coupled to the second end of the housing; and a third spring (such as a longitudinal spring) coupled to the second end of the housing; inserting at least a portion of the body at the second end of the housing and the second transverse spring through the opening; compressing the third spring against the second end of the opening; inserting at least a portion of the body at the first end of the housing and the first transverse spring through the opening; and moving the housing toward the first end of the opening, such that the housing is positioned with the third spring biasing the housing toward the first end of the opening, and the first transverse spring and the second transverse spring each biasing a lip of the housing that is positioned external to the internal cavity toward an external surface of the wall of the first tube.

In some embodiments, the method further comprises: moving the housing toward the second end of the opening; moving the first end of the housing away from the external surface of the wall of the first tube, such that at least a portion of the first transverse spring is positioned external to the internal cavity; and removing the housing from the internal cavity.

For purposes of this summary, certain aspects, advantages, and novel features of the inventions are described herein. It is to be understood that not necessarily all such advantages may be achieved in accordance with any particular embodiment of the inventions. Thus, for example, those skilled in the art will recognize that the inventions may be embodied or carried out in a manner that achieves one advantage or group of advantages as taught herein without necessarily achieving other advantages as may be taught or suggested herein.

BRIEF DESCRIPTION OF THE DRAWINGS

The foregoing and other features, aspects, and advantages of the present disclosure are described in detail below with reference to the drawings of various embodiments, which are intended to illustrate and not to limit the disclosure. The features of some embodiments of the present disclosure, which are believed to be novel, will be more fully disclosed in the following detailed description. The following detailed description may best be understood by reference to the accompanying drawings wherein the same numbers in different drawings represents the same parts. All drawings are schematic and are not intended to show any dimension to scale. The drawings comprise the following figures in which.

DETAILED DESCRIPTION

Figure 1:
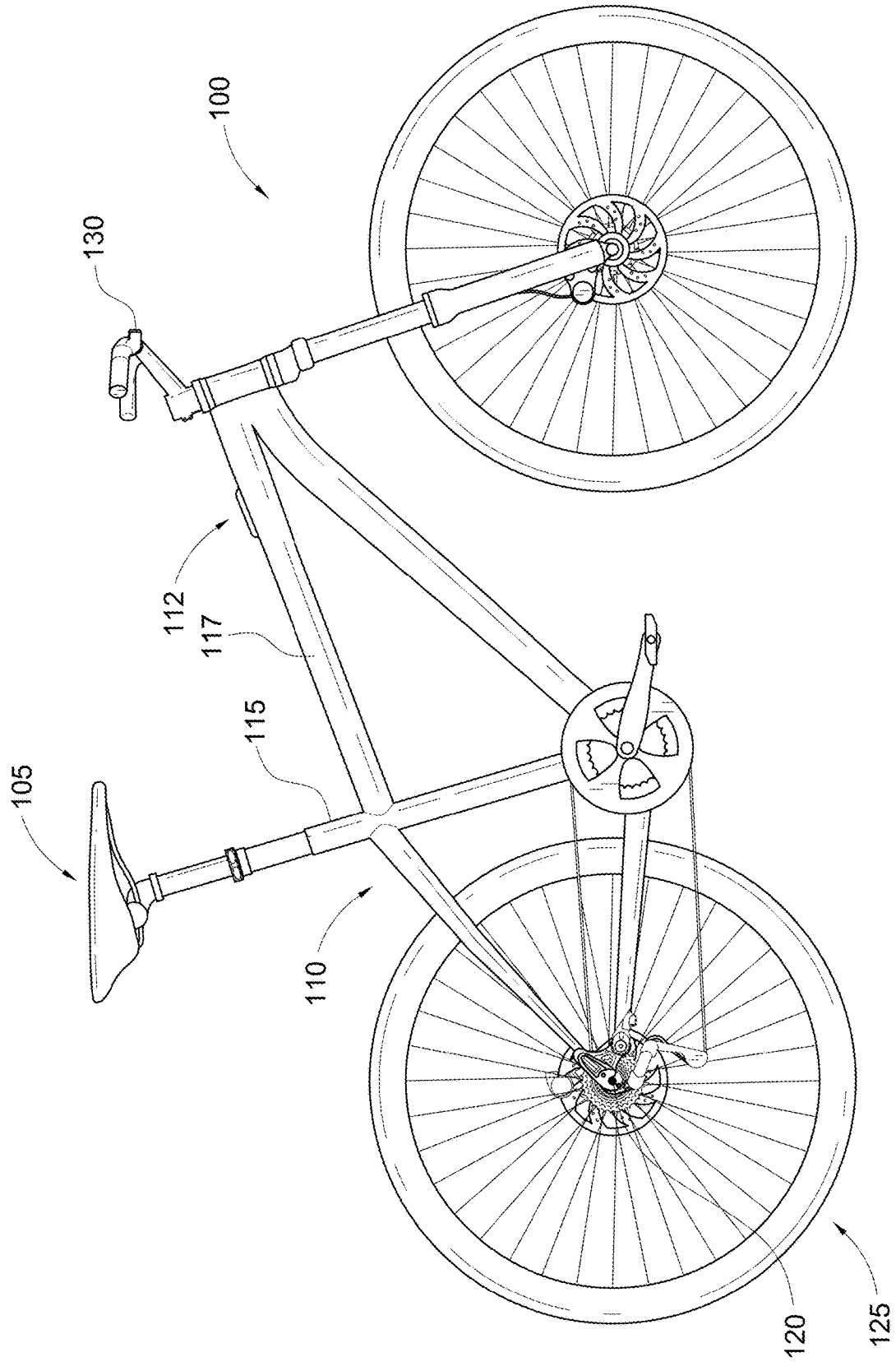
FIG. 1 illustrates a side view of an embodiment of a bicycle with an example in-tube mounted display assembly.

Although several embodiments, examples, and illustrations are disclosed below, it will be understood by those of ordinary skill in the art that the inventions described herein extend beyond the specifically disclosed embodiments, examples, and illustrations and include other uses of the inventions and obvious modifications and equivalents thereof. Embodiments of the inventions are described with reference to the accompanying figures, wherein like numerals refer to like elements throughout. These drawings are considered to be a part of the entire description of some embodiments of the inventions. The terminology used in the description presented herein is not intended to be interpreted in any limited or restrictive manner simply because it is being used in conjunction with a detailed description of certain specific embodiments of the inventions. In addition, embodiments of the inventions can comprise several novel features and no single feature is solely responsible for its desirable attributes or is essential to practicing the inventions herein described.

The present disclosure describes various embodiments of systems, devices, and methods for removably mounting an electronic device, a display assembly, a controller, and/or the like within a cavity of a bicycle tube, such as within a cavity of a top tube of an electric bicycle. As bicycles, and particularly electric bicycles, become more sophisticated, it can be desirable to include one or more electronic devices, such as an electronic display, a user input device, and/or the like in a portion of the bicycle that is convenient for a user to access. For example, it may be desirable to have an electronic display, control inputs, and/or the like positioned on or in an electric bicycle's top tube near the handlebars, in an area easily visible to a rider.

One complication with including such electronic assemblies in a bicycle is that the electronics, software, and/or the like may be continually improved by a manufacturer, and thus it may be desirable to be able to access a port, such as a USB port or similar, in order to update the firmware, conduct maintenance, and/or the like. Further, it can be desirable to position such port within the cavity of the bicycle frame tube, so that the port does not detract from the bicycle's appearance, to maintain water-tightness, and/or the like. One option for implementing a removable display assembly (such as to access a port as needed) would be to utilize one or more fasteners, such as bolts, screws, and/or the like that enable a user to remove the display assembly, remove an access panel to access an internal portion of the display assembly, and/or the like. Using such fasteners has a variety of drawbacks, however. For example, using fasteners can detract from a clean appearance of the bicycle, can require that a user have a tool to get the display assembly out, can reduce the structural integrity of the tube within which the display assembly is installed, can increase manufacturing costs, can be a point at which moisture may enter the top tube, and/or the like. The systems, methods, and devices disclosed herein solve these problems by, for example, presenting fastenerless display assemblies that can be installed into a bicycle tube, such as a top tube, retained in place with respect to the tube, and/or removed from the tube without requiring fasteners such as screws, bolts, pins, and/or the like.

Some embodiments disclosed herein comprise a display assembly that comprises a housing that fits at least partially through an opening in a wall of a bicycle top tube, such that at least a portion of the housing is positioned within a cavity of the top tube, and such that a lip extending around a top of the housing is resting on an exterior surface of the wall of the top tube. The display assembly further comprises a plurality of springs that constrain or bias movement of the display assembly with respect to the top tube in a plurality of directions, in order to sufficiently constrain the positioning of the display assembly with respect to the top tube without requiring fasteners.

For example, some embodiments may comprise one or more longitudinal springs, referring to a spring that biases the display assembly in a longitudinal direction with respect to an opening in a bicycle tube (e.g. that biases the display assembly along the direction at which a bicycle top tube extends, from front to back or back to front). Further, some embodiments may comprise one or more vertical springs, referring to a spring that biases the display assembly in a vertical direction with respect to an opening in a bicycle tube (e.g., that biases the display assembly along a direction of insertion through the opening in the bicycle tube), which may be perpendicular to the longitudinal direction. In some embodiments, one or more springs desirably bias the display in a direction transverse to the inner surface of the tube. In some embodiments, one or more additional springs may be included to bias the display assembly along, for example, a lateral direction, resulting in biasing constraints along three orthogonal directions. However, the design may also be designed such that there is relatively little to no play or movement available along the lateral direction, and/or such that the biasing forces supplied by the longitudinal and/or vertical springs also provide at least some resistance to side to side/lateral motion of the housing with respect to the tube, and thus an assembly that includes only longitudinal and vertical springs may sufficiently constrain the display assembly. Further, as described in more detail below, some embodiments may be configured to form an interference fit with the top tube opening in the lateral direction, thus adding a third orthogonal constraint to the spring constraints in the longitudinal and vertical directions. See also the discussion of FIG. 2C below for an example coordinate system comprising longitudinal, lateral, and vertical axes.

One benefit of the designs disclosed herein is that the display assembly can be cleanly installed in the top tube or another tube of the frame without any visible and/or external joint elements or fasteners, such as screws, bolts, pins, and/or the like. Another benefit of the designs disclosed herein is that the display assemblies disclosed herein are able to be used in a wide variety of bicycles that utilize frame tubes having various wall thicknesses, such as frame tubes made from carbon fiber, steel, aluminum, and/or the like. By utilizing a plurality of springs that bias the positioning of the display assembly with respect to the bicycle tube, the springs can be used with different thicknesses of tubes, can help to account for larger tolerances and variations in sizes of the opening and housing, and/or the like.

It should be noted that, when the present disclosure refers to a fastenerless assembly or an assembly that does not require fasteners, the disclosure is referring to components that directly retain or constrain the display assembly with respect to the bicycle tube (such as springs that directly contact the bicycle tube). The term fastenerless is not intended to require that the display assembly and/or bicycle tube do not include any fasteners. Rather, to the extent that the display assembly and/or the bicycle tube do include any fasteners, the term fastenerless means that those fasteners are not directly used to constrain a position of the display assembly with respect to the bicycle tube. For example, the display assembly may include one or more fasteners that couple the plurality of springs to the housing of the display assembly, but in such an embodiment it is the springs that directly interface with the bicycle tube, not the fasteners.

Bicycle Systems with In-Tube Mounted Electronic Devices

FIG. 1 illustrates a side view of a bicycle 100, such as an electric bicycle. The bicycle 100 can include a seat 105 and a frame 110. The seat 105 can be supported by a seat tube 115. An electronic device 112, such as a display assembly, can be mounted to the frame 110 and positioned at least partly in a top tube 117 of the frame 110 that extends between the seat tube 105 and handle bar mount. The bicycle 100 also can include a rear axle 120 of a rear wheel assembly 125. A motor can be positioned proximate the rear wheel assembly 125 for imparting motion to the bicycle 100, and one or more sensors can be positioned proximate the rear wheel assembly 125 or the front wheel assembly for monitoring operations or properties of the bicycle 100. A remote control device 130 can be attached to handle bars of the bicycle 100 and used to, for example, control the electronic device 112 and/or other portions of the electric bicycle.

This application incorporates by reference U.S. Pat. No. 10,472,015, titled IN-FRAME MOUNTED BICYCLE MONITORING DEVICE, issued Nov. 12, 2019, in its entirety, which is considered part of the specification. Various embodiments thereof can be used or modified for use with those as recited herein. For example, various embodiments of display assemblies disclosed herein can be used or modified for use with bicycle frames disclosed in the '015 patent, and various embodiments of electronic devices disclosed in the '015 patent can be modified to use the removable mounting techniques disclosed herein.

Figures 2A, 2B, 2C:
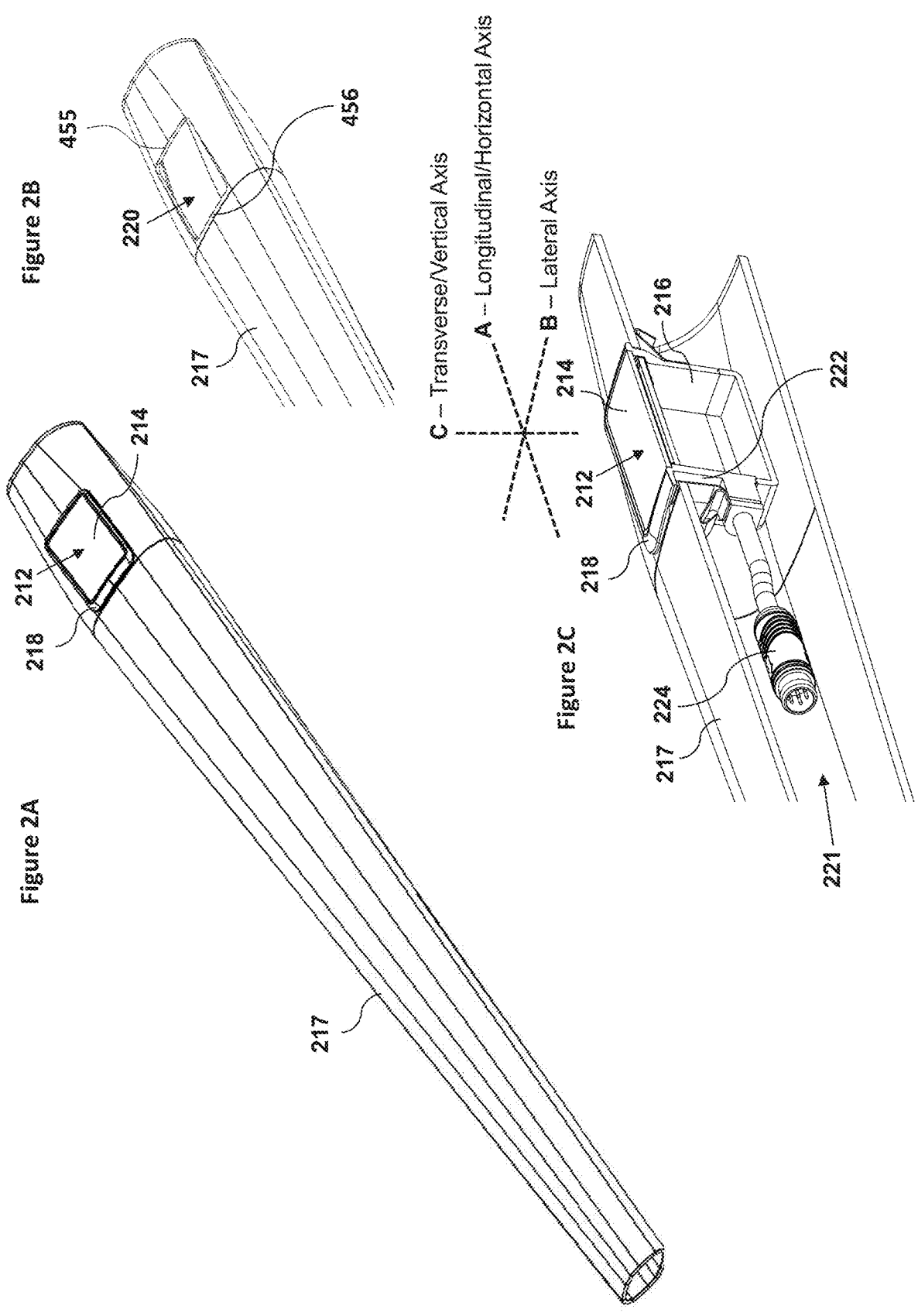
FIG. 2A illustrates a perspective view of an embodiment of a bicycle top tube with an example in-tube mounted display assembly.
FIG. 2B illustrates a perspective view of the bicycle top tube of FIG. 2A with the display assembly removed.
FIG. 2C illustrates a cross-sectional view of the bicycle top tube with an example in-tube mounted display assembly of FIG. 2A.

FIGS. 2A-2C illustrate another embodiment of an electronic device or display assembly 212 mounted to a top tube 217. FIG. 2A is a perspective view of the top tube 217 having the display assembly 212 attached thereto. FIG. 2B is a perspective view of a portion of the top tube 217 with the display assembly 212 removed to show the opening 220 through the wall of the top tube 217. FIG. 2C is a perspective cross-sectional view that illustrates the display assembly 212 mounted in the top tube 217.

With reference to FIG. 2C, the display assembly 212 comprises a housing 216 that includes a body 222 extending at least partially into the cavity 221 of the top tube 217. The housing 216 further comprises a lip 218 extending about a top of the housing 216 and engaged with an exterior surface of the wall of the top tube 217. As one of skill in the art will appreciate from the prior and following disclosure, in some embodiments, the lip 218 may be directly engaged with the exterior surface of the wall of the top tube 217 (e.g., through direct contact between at least a portion of the lip 218 and at least a portion of the exterior surface of the wall). Similarly, as one of skill in the art will appreciate from the prior and following disclosure, in some embodiments, the lip 218 may be indirectly engaged with the exterior surface of the wall (e.g., through a gasket, a compressible member, and/or the like). In some embodiments, the lip 218 may include an integrally formed gasket, compressible member, and/or the like that engages the exterior surface of the wall. The display assembly 212 further comprises a display 214 positioned at a top of the housing 216 such that the display 214 is visible, for example, to a rider of the bicycle. The display 214 may comprise a screen, for example, an LCD screen, a touchscreen, an OLED screen, and/or the like. Finally, the display assembly 212 comprises one or more electrical wires and/or connectors 224 for connection to other portions of the electric bicycle system, for connection to a computer, such as for configuration changes or firmware updates, and/or the like.

The display assembly 212 is desirably retained in place with respect to the opening 220 of the top tube 217 using a fastenerless system that comprises a plurality of springs that constrain the display assembly 212 with respect to the top tube 217 in a plurality of directions. FIG. 2C illustrates an example coordinate system for these directions that is used throughout the present disclosure. Specifically, FIG. 2C illustrates a longitudinal or horizontal axis that extends along a longitudinal direction of the housing 216 (for example the front to back direction with reference to a rider seated on a bicycle), a lateral axis B that extends along a lateral direction of the housing 216 (for example, the left to right direction with reference to a rider seated on a bicycle), and a transverse or vertical axis C that extends along a transverse or vertical direction with respect to the housing 216 (for example, the up to down direction with reference to a rider seated on a bicycle). In some embodiments, the orientation of the transverse or vertical axis C is defined by a direction that is transverse to an exterior or interior surface of the bicycle tube that surrounds the opening 220. Further details of such a fastenerless system are described below.

Figures 3A, 3B, 3C:
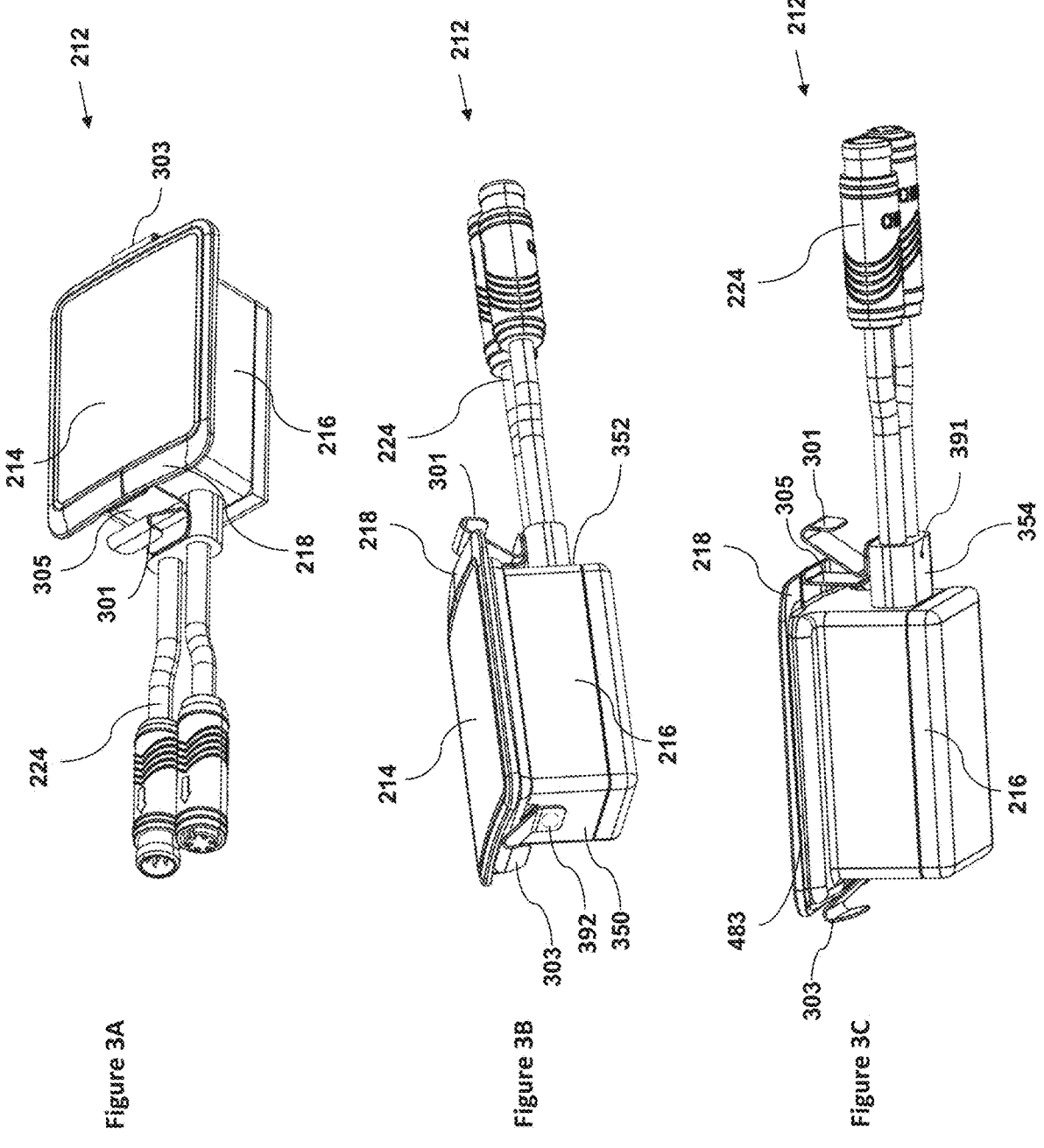
FIGS. 3A-3C illustrate perspective views of the display assembly of FIG. 2A removed from the bicycle top tube.

FIGS. 3A-3C are perspective views, each from a different orientation, of the display assembly 212 of FIG. 2A. These figures show additional detail of the display assembly 212, such as a vertical spring 303 that is coupled to a first end 350 of the housing 216, and a vertical spring 301 and a longitudinal spring 305 that are each coupled to a second end 352 of the housing 216. More specifically, the vertical spring 301 and longitudinal spring 305 are coupled to a boss or protruding member 354 of the second end 352 of the housing 216. The vertical and longitudinal springs 301, 303, 305 may be coupled to the housing 216 using various techniques, such as fasteners, insert molding, adhesives, metal or polymer straps, and/or the like. For example, one or more fasteners, such as screws, may be located at the example locations 391, 392 shown in FIGS. 3C and 3B, respectively. In some embodiments, the same fastener or fasteners at location 391 may be used to couple both of the vertical spring 310 and longitudinal spring 305 to the housing 216. In this embodiment, the springs 301, 303, 305 are desirably formed from sheet metal (which may include spring steel and/or other types of sheet metal) that is bent or otherwise formed into the shapes shown in FIGS. 3A-3C. Various other materials and/or configurations of springs may be used, as long as the springs are configured to provide a biasing force in an appropriate direction. For example, coil springs, torsion springs, elastomeric members, and/or the like may be used in some embodiments. Further, the springs disclosed herein may alternatively be referred to as spring members, resilient members, biasing members, elastically bendable members, elastically compressible members, elastically extendable members, and/or the like. Additionally, the term "vertical spring" may be used interchangeably with the term "transverse spring," both terms of which refer to a spring that is used to bias the display assembly along a transverse or vertical direction (e.g., along the direction of transverse/vertical axis C of FIG. 2C).

Example Removable Retention Systems and Methods

Figures 4A, 4B, 4C:
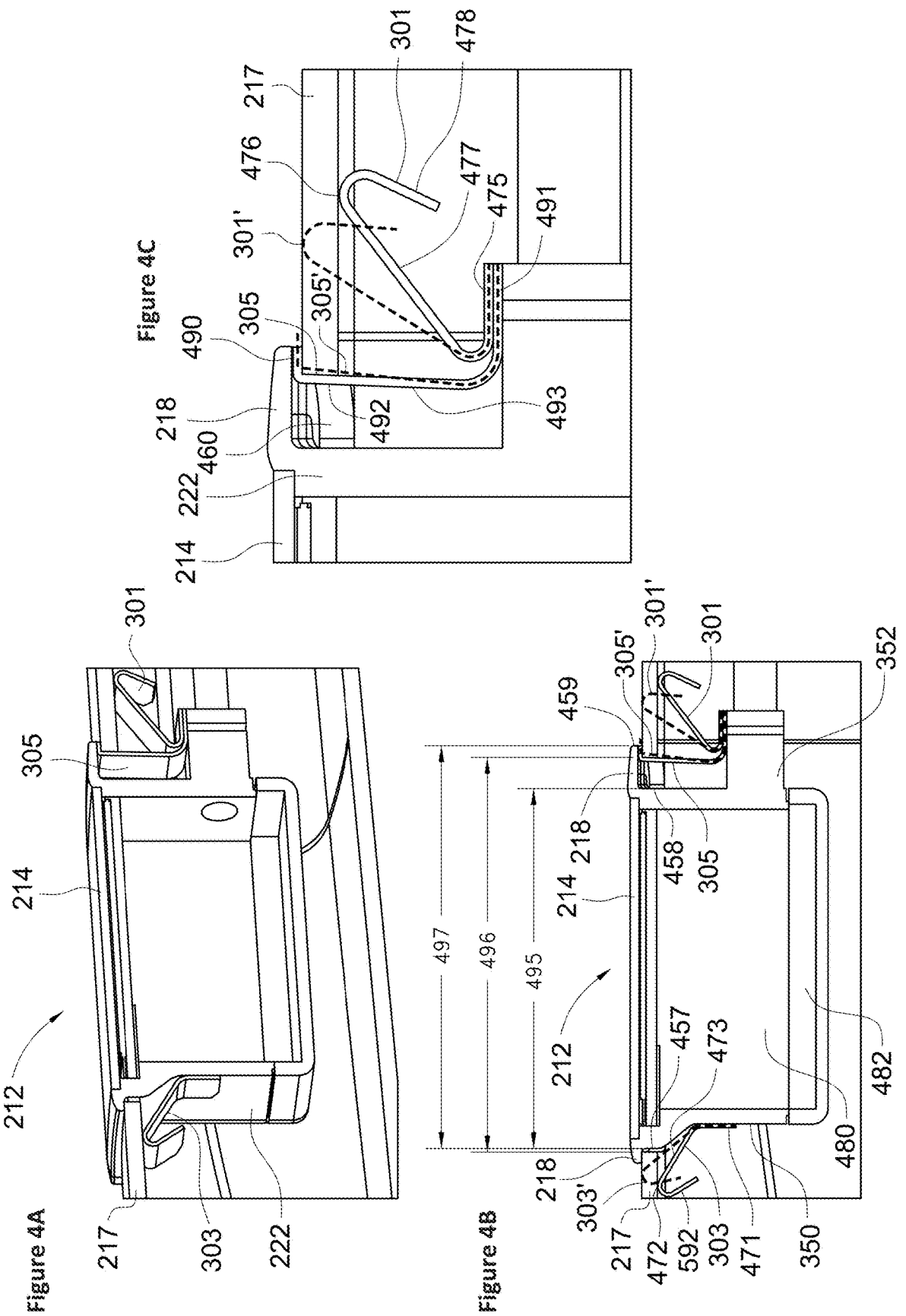
FIGS. 4A-4C illustrate cross-sectional views of the display assembly and top tube of FIG. 2A.

FIGS. 4A-4C and 5A-5C illustrate more details as to how the display assembly 212 is retained and/or constrained with respect to the top tube 217 in a fastenerless configuration. FIG. 4A is a perspective cross-sectional view of the display assembly 212 in an installed position with respect to the top tube 217. FIG. 4B illustrates a similar cross-sectional view to FIG. 4A, except viewed perpendicular to a longitudinal axis of the top tube 217 (e.g., along the lateral direction). FIG. 4C illustrates an enlarged cross-sectional view of a portion of FIG. 4B. In FIGS. 4A, 4B, and 4C, the solid lines depicting springs 301, 303, and 305 depict the installed, compressed, or bent positions of the springs (e.g., the configurations the springs will be deformed into when the display assembly 212 is in its installed position in the top tube 217). For reference, FIGS. 4B and 4C further depict the relaxed states of the springs 301, 303, and 305 using dashed lines 301', 303', and 305', respectively.

With reference to FIG. 4B, the display assembly 212 comprises a number of components, including a vertical spring 303, a longitudinal spring 305, a vertical spring 301, an upper portion 480 of the body 222, and a lower portion or cap portion 482 of the body 222. The vertical spring 303 positioned at the first end 350 in this embodiment desirably comprises sheet metal that is formed into the shape shown in FIG. 4B (e.g., a shape comprising a base portion 471 coupled to the housing, a wall-engaging portion 472, an elastic portion 473 extending between the base portion 471 and the wall-engaging portion 472, and an angled or ramp portion 592 extending away from the wall-engaging portion 472), and that acts like a spring in the vertical direction (e.g., along axis C of FIG. 2C), which is transverse to the interior surface of the tube surrounding the opening 220. The vertical spring 301 positioned at the second end 352 in this embodiment also desirably comprises sheet metal that is formed into the shape shown in FIG. 4C (e.g., a shape comprising a base portion 475 coupled to the housing, a wall-engaging portion 476, an elastic portion 477 extending between the base portion 475 and the wall-engaging portion 476, and an angled or ramp portion 478 extending away from the wall-engaging portion 476), and that acts like a spring in the vertical direction. Accordingly, vertical springs 303 and 301 desirably operate to bias the display assembly 212 in the vertical or transverse direction (e.g., along axis C of FIG. 2C), and thus to bias the lip 218 against the exterior surface of the wall of the top tube 217 (or at least toward the exterior surface, such as in a version that includes a gasket or similar between the lip 218 and the exterior surface of the wall of the top tube 217, which may prevent the lip 218 from directly engaging the exterior surface). Using the vertical springs 303, 301 for this function provides various benefits, including allowing the assembly to be used with tubes having various wall thicknesses. For example, in a tube with a thicker wall, the vertical springs 303, 301 will bend or move further from their respective relaxed states when the display assembly 212 is in the installed position, while in a tube with a thinner wall, the vertical springs 303, 301 will bend or move less from their respective relaxed states when the display assembly 212 is in the installed position.

The longitudinal spring 305 positioned at the second end 352 in this embodiment also desirably comprises sheet metal that is formed into the shape shown in FIG. 4C (e.g., a shape comprising a base portion 491 coupled to the housing, a wall-engaging portion 492, an elastic portion 493 extending between the base portion 491 and the wall-engaging portion 492, and a lip 490 extending away from the wall-engaging portion 492). Unlike vertical springs 301, 303, however, longitudinal spring 305 desirably acts like a spring along the longitudinal or horizontal direction (e.g., along axis A of FIG. 2C). The longitudinal spring 305 desirably engages a portion of the opening through the wall of the top tube 217 such that the longitudinal spring 305 can bias the body 222 of the display assembly 212 toward the left side of FIG. 4B. This can provide multiple benefits, including constraining the display assembly 212 along the longitudinal direction, and allowing for easy and/or toolless insertion and removal of the display assembly 212 from the opening in the top tube 217, as described in more detail below.

With continued reference to FIG. 4B, the body 222 that comprises the upper and lower portions 480, 482 desirably defines a cavity that can contain various components, such as electronic components that support the display 214, such as a battery, a circuit board, and/or the like. The body 222 may be formed from a variety of materials, such as plastic, metal, carbon fiber, and/or the like. In some embodiments, it may be desirable for at least the area of the body 222 that is positioned within the opening of the top tube, and that may laterally come in contact with the perimeter of the opening of the top tube (such as surface 483 called out in FIG. 3C) to be formed from or at least comprise a material that is relatively soft, compressible, and/or elastic. For example, it may be desirable for the upper portion of the housing (such as surface 483) to form at least a slight interference fit with the opening 220 in the top tube 217 (see FIG. 2B), at least along the lateral direction (e.g., along axis B of FIG. 2C). For example, if at least the upper portion of the housing of the display assembly 212 uses an elastomer, gasket, or other material that is relatively soft or compressible, this material may be able to help to form a friction fit along the lateral direction, which can sufficiently constrain the display assembly 212 along the lateral direction with respect to the top tube. The addition of this lateral interference fit to the vertical and longitudinal springs 301, 303, 305 will desirably fully constrain the display assembly 212 with respect to the top tube 217 in the installed position. Alternatively, there may not be an interference fit along the lateral direction between the display assembly 212 and top tube opening 220. For example, the lateral fit between the display assembly 212 and top tube opening 220 may be close enough that any potential lateral movement is acceptable. Further, as another example, the vertical and/or longitudinal springs 301, 303, 305 may introduce at least some static friction in the lateral direction that helps to constrain the display assembly 212 along the lateral direction.

As mentioned above, FIGS. 4A, 4B, and 4C illustrate the springs 301, 303, 305 in their installed (e.g., installed, pre-tensioned, bent, compressed, or deformed) configuration, with FIGS. 4B and 4C also illustrating their relaxed configuration in dashed lines (see elements 301', 303', and 305'). Desirably, in the installed position, each of the springs is pre-tensioned or deformed from its relaxed state such that a biasing force is generated in the installed position. The pretension or biasing force for vertical or transverse springs 301, 303 is desirably in the vertical or transverse direction, which will help to hold the body 222 in the correct position with lip 218 engaged with the outer surface of the top tube 217 (directly or indirectly, such as through a gasket or the like), and which can also compensate for different wall thicknesses of different frame tubes. The pretension or biasing force of longitudinal spring 305 desirably presses or biases the housing 216 against the opening 220 (directly or indirectly, such as through a gasket or the like) at the end opposite of the longitudinal spring 305 (for example, the first end 350 shown in FIG. 3B). In some embodiments, the housing 216 may incorporate a stop feature (such as a protrusion, an elastomeric member, a rigid member, and/or the like) that is configured to engage a longitudinal facing surface of the perimeter of the opening 220.

FIG. 4C illustrates an example of how springs 301 and 305 are pretensioned in the installed position (with the dashed line 301' showing the relaxed position of vertical spring 301, and the dashed line 305' showing the relaxed position of longitudinal spring 305). FIG. 4C also shows that there is a longitudinal gap 460 between the body 222 and the forward edge of the opening in the wall of the top tube 217. Desirably, the longitudinal gap 460 is wide enough to allow the body 422 to be slid longitudinally (to the right with reference to the orientation of FIG. 4C) in order to install or remove the display assembly 212. For example, as one of skill in the art will appreciate from the prior and following disclosure, with reference to FIG. 4B, a longitudinal length 496 of the opening may be at least 105% of a longitudinal length 495 of the housing. In some embodiments, the longitudinal length 496 of the opening may be at least 105%, 108%, 110%, or 112% of the longitudinal length 495 of the housing. The longitudinal length 496 of the opening is the maximum distance between the forward and rearward edges of the wall 217 that defines the opening (e.g., between edges 455 and 456 of opening 220 of FIG. 2B), measured in the longitudinal direction (e.g., measured parallel to longitudinal axis A of FIG. 2C). The longitudinal length 495 of the housing is likewise the maximum distance between the forward and rearward edges of the portion of the housing body 222 that is positioned within the opening (e.g., between edges 457 and 458 shown in FIG. 4B), measured in the longitudinal direction (e.g., measured parallel to longitudinal axis A of FIG. 2C). Also, as one of skill in the art will appreciate from the prior and following disclosure, the lip 218 desirably comprises a sufficient longitudinal length to cover the longitudinal gap 460 in the installed position. Further, as one of skill in the art will appreciate from the prior and following disclosure, the lip 218 desirably comprises a sufficient longitudinal length to cover an upper hook or lip portion 490 of the longitudinal spring 305. For example, with continued reference to FIG. 4B, a longitudinal length 497, measured in the longitudinal direction (e.g., measured parallel to longitudinal axis A of FIG. 2C), from the first end of the housing (e.g., from the same forward edge 457 of the housing used to define housing longitudinal length 495) to an edge 459 of the lip 218 (e.g., to the portion of the lip 218 that is furthest from the first end of the housing), may be at least 101% of the longitudinal length 496 of the opening. In some embodiments, the longitudinal length 497 is at least 100%, 102%, 103%, or 104% of the longitudinal length 496 of the opening.

Figures 5A, 5B, 5C:
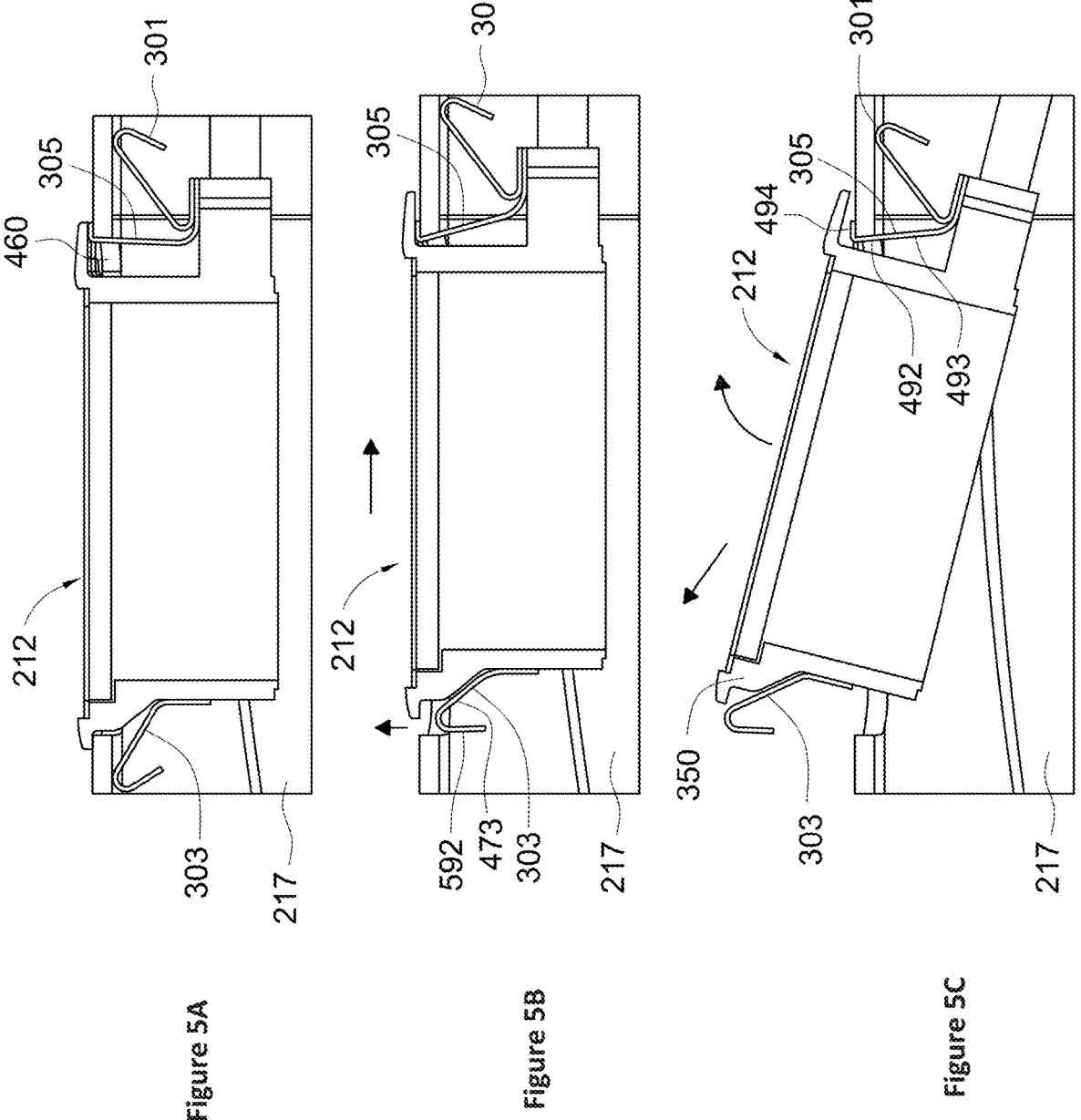
FIGS. 5A-5C illustrate, in cross-sectional views, a procedure for removing the display assembly from the top tube of FIG. 2A.

As mentioned above, it may be desirable for the display assembly 212 to be easily removed or dismounted from the bicycle frame, such as in order to perform software updates, replace the unit, and/or the like. FIGS. 5A-5C illustrate a process of removing the display assembly 212 from the top tube 217, with the insertion procedure being the reverse of the process shown in FIGS. 5A-5C. FIG. 5A illustrates the display assembly 212 in the installed position. To start the removal process, the display assembly 212 is slid longitudinally against the pressure or biasing force of longitudinal spring 305 (to the right, as shown in FIG. 5B). The display assembly 212 is desirably slid longitudinally sufficiently such that gap 460 (see FIG. 5A) is closed sufficiently for a corresponding gap to be created on the other longitudinal end of the assembly 212, thus allowing vertical spring 303 to disengage the interior surface of the top tube. Next, moving to FIG. 5C, the first end 350 of the display assembly 212 can be pivoted upward once the vertical spring 303 is clear of the interior surface of the top tube 217. Once the display assembly 212 is pivoted far enough, the display assembly 212 can be removed from the cavity in the top tube 217.

The installation process is the reverse of the removal process. Specifically, the display assembly 212 can first be placed through the opening of the top tube 217 at an angle until longitudinal spring 305 engages an edge of the opening, as shown in FIG. 5C. For example, the wall engaging portion 492 of spring 305 may engage the edge of the opening and start to cause deformation of elastic portion 493. Desirably, the lip 490 of spring 305 engages an exterior surface of the top tube 217, to prevent the wall engaging portion 492 from moving beyond the edge of the opening into the cavity of the tap tube. At this point, longitudinal spring 305 and vertical spring 301 are close to being in their installed positions. Next, the display assembly 212 is rotated downward until vertical spring 303 passes through the opening in the top tube 217, as shown in FIG. 5B. Finally, the display assembly 212 is slid longitudinally (to the left with reference to FIG. 5A) such that the display assembly 212 ends up in the final installed position, as shown in FIG. 5A. In some embodiments, one or more fasteners may then be installed, such as one or more screws, to act as a secondary retention mechanism. Desirably, however, as discussed above, the installation is fastenerless, and the pretension of the springs is sufficient to retain the display assembly 212 in place.

In some embodiments, the vertical spring 303 comprises an angled portion or ramp portion 592 at its distal end that, for example, helps to compress or bend the spring 303 as the display assembly 212 is slid longitudinally from the right to the left (with reference to the right and left directions of FIGS. 5B and 5A). Although such a ramp or angled portion 592 is not required, it can be helpful, such as to not cause the spring 303 to get caught or hung up on the edge of the opening through the top tube 217 when the user tries to slide the display assembly 212 into the installed position. The angled portion or ramp portion 592 may also be helpful when removing the display assembly, such as to prevent the spring 303 from getting caught or hung up on the edge of the opening through the top tube 217 when the user tries to pivot the first end 350 upward. In some embodiments, the angled or ramp portion 592 forms an acute angle with elastic portion 473, as can be seen in FIG. 5B. In some embodiments, an angle between the angled or ramp portion 592 and the elastic portion 473, with the spring 303 in its relaxed state, is desirable within a range of 10-40 degrees, 20-40 degrees, 25-45 degrees, or 30-50 degrees.

Additional Information

The embodiments described herein can provide a number of benefits. For example, certain embodiments are visually clean, because no connection elements, such as bolts or other fasteners, can be seen externally. As another example, certain embodiments can provide a screen (such as display 214) that is flush or almost flush with an outer surface of the frame. In some embodiments, the screen is raised from the frame by only about 1.5 mm. As another example, certain embodiments can enable the assembly to have a relatively minimal plastic skirt around the screen (such as lip 218), which can be visually appealing. As another example, certain embodiments can be used with various different frame wall thicknesses, layouts (such as mono bikes, road bikes, mountain bikes, and/or the like), and materials (carbon fiber, aluminum, and/or the like). As another example, certain embodiments can make the manufacturing of the bicycle frame easier and/or relatively simple, by merely requiring a cutout in the top tube of the frame without additional special processes (such as generating a recess, brazing, complicated hydroforming, inserts placed in the frame, and/or the like), which can be a significant advantage, particularly when manufacturing in relatively high quantities. It should be noted, however, that any such additional special processes may be used with some embodiments. As another example, certain embodiments are easily dismountable or removable, such as to perform software updates, replace the assembly, and/or the like. As another example, certain embodiments utilize relatively simple geometries and materials, which provide a way to assemble the system at relatively low cost.

Various other modifications, adaptations, and alternative designs are of course possible in light of the above teachings. Therefore, it should be understood at this time that within the scope of the appended claims the invention may be practiced otherwise than as specifically described herein. It is contemplated that various combinations or subcombinations of the specific features and aspects of the embodiments disclosed above may be made and still fall within one or more of the inventions. Further, the disclosure herein of any particular feature, aspect, method, property, characteristic, quality, attribute, element, or the like in connection with an embodiment can be used in all other embodiments set forth herein. Accordingly, it should be understood that various features and aspects of the disclosed embodiments can be combined with or substituted for one another in order to form varying modes of the disclosed inventions. Thus, it is intended that the scope of the present inventions herein disclosed should not be limited by the particular disclosed embodiments described above. Moreover, while the invention is susceptible to various modifications, and alternative forms, specific examples thereof have been shown in the drawings and are herein described in detail. It should be understood, however, that the invention is not to be limited to the particular forms or methods disclosed, but to the contrary, the invention is to cover all modifications, equivalents, and alternatives falling within the spirit and scope of the various embodiments described and the appended claims. Any methods disclosed herein need not be performed in the order recited.

Conditional language, such as, among others, "can," "could," "might," or "may," unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment. The headings used herein are for the convenience of the reader only and are not meant to limit the scope of the inventions or claims.

What is claimed is:

1. A bicycle comprising:

a frame having a plurality of tubes including at least a first tube, the first tube comprising a wall that defines an internal cavity, the first tube further comprising an opening, with a portion of the wall surrounding the opening, the opening extending along a longitudinal direction from a first end to a second end; and a display assembly removably mounted to the first tube, the display assembly comprising:

a housing comprising a body that extends along the longitudinal direction from a first end to a second end, wherein the body further extends through the opening of the first tube along a second direction that is transverse to an exterior surface of the portion of the wall that surrounds the opening, the body at least partially positioned within the internal cavity of the first tube, the housing further comprising a lip positioned over the exterior surface;

a display coupled to the body of the housing such that at least a portion of the display is visible external to the first tube;

a first transverse spring coupled to the first end of the housing;

a second transverse spring coupled to the second end of the housing; and a longitudinal spring coupled to the second end of the housing, wherein the first transverse spring and the second transverse spring are each compressed against an interior surface of the portion of the wall that surrounds the opening to generate a transverse biasing force along the second direction that biases the lip toward the exterior surface, wherein the longitudinal spring is compressed against a portion of the first tube to generate a longitudinal biasing force that biases the housing toward the first end of the opening, wherein the first transverse spring, the second transverse spring, and the longitudinal spring are each coupled to the housing using one or more fasteners, and wherein at least one of the one or more fasteners is used to couple both the second transverse spring and the longitudinal spring to the housing.

2. The bicycle of claim 1, wherein the first tube is a top tube.

3. The bicycle of claim 1, wherein the longitudinal spring is compressed against the second end of the opening.

4. The bicycle of claim 1, wherein the longitudinal spring comprises a lip positioned in contact with the exterior surface of the portion of the wall that surrounds the opening.

5. The bicycle of claim 1, wherein the lip of the housing extends longitudinally a sufficient distance to cover a gap between the second end of the opening and the second end of the body of the housing with the housing abutting the first end of the opening.

6. The bicycle of claim 1, wherein the longitudinal spring comprises sheet metal.

7. The bicycle of claim 1, wherein the first transverse spring and the second transverse spring each comprise sheet metal.

8. The bicycle of claim 1, wherein the opening comprises a longitudinal length that is at least 105% of a longitudinal length of the body of the housing.

9. The bicycle of claim 1, wherein no fasteners are used to mount the display assembly to the first tube.

10. The bicycle of claim 1, wherein at least a portion of the housing forms an interference fit with the opening along a lateral direction.

11. The bicycle of claim 10, wherein the at least a portion of the housing that forms an interference fit with the opening along the lateral direction comprises a compressible material.

12. A removable display assembly for a bicycle, the removable display assembly comprising:

a housing comprising a body that extends along a first direction from a first end to a second end, wherein the body further extends along a second direction, such that at least a portion of the body can be positioned through an opening in a wall of a first tube of a bicycle frame to be at least partially positioned within an internal cavity of the first tube, the housing further comprising a lip configured to extend at least partially over an exterior surface of the wall of the first tube;

a display coupled to the body of the housing such that at least a portion of the display will be visible external to the first tube when the at least a portion of the body is at least partially positioned within the internal cavity of the first tube;

a first spring coupled to the first end of the housing;

a second spring coupled to the second end of the housing; and a third spring coupled to the second end of the housing, wherein the first spring and the second spring are each configured to be compressed against an interior surface of the wall to generate a biasing force that biases the lip along the second direction toward the exterior surface of the wall, wherein the third spring is configured to be compressed against a portion of the first tube to generate a biasing force that biases the housing along the first direction toward a first end of the opening, wherein the first spring, the second spring, and the third spring are each coupled to the housing using one or more fasteners, and wherein at least one of the one or more fasteners is used to couple both the second spring and the third spring to the housing.

13. The removable display assembly of claim 12, wherein the first direction is a longitudinal direction, and the second direction is a vertical direction.

14. The removable display assembly of claim 12, wherein the third spring is configured to be compressed against a second end of the opening.

15. The removable display assembly of claim 12, wherein the third spring comprises a lip configured to be positioned in contact with the exterior surface of the wall.

16. The removable display assembly of claim 12, wherein the first spring, the second spring, and the third spring each comprise sheet metal.

17. The removable display assembly of claim 12, wherein at least a portion of the housing comprises a compressible material configured to form an interference fit with the opening along a third direction that is perpendicular to both the first direction and the second direction.

18. The removable display assembly of claim 12, further comprising:

a bicycle frame having a plurality of tubes including at least the first tube, wherein the at least a portion of the body is positioned through the opening in the wall of the first tube of the bicycle frame to be at least partially positioned within the internal cavity of the first tube.

19. The removable display assembly of claim 18, wherein the lip of the housing extends along the first direction a sufficient distance to cover a gap between a second end of the opening and the body of the housing with the housing abutting the first end of the opening.

20. The removable display assembly of claim 18, wherein the opening comprises a length along the first direction that is at least 105% of a length along the first direction of the body of the housing.

21. The removable display assembly of claim 18, wherein no fasteners are used to mount the display assembly to the first tube.

22. A bicycle comprising:

a frame having a plurality of tubes including at least a first tube, the first tube comprising a wall that defines an internal cavity, the wall comprising an opening that extends along a longitudinal direction from a first end to a second end; and a display assembly removably mounted to the first tube, the display assembly comprising:

a housing comprising a body that extends along the longitudinal direction from a first end to a second end, wherein the body further extends along a vertical direction through the opening of the first tube and is at least partially positioned within the internal cavity of the first tube, the housing further comprising a lip directly or indirectly engaged with the exterior surface of the wall;

a display coupled to the body of the housing such that at least a portion of the display is visible external to the first tube;

a first vertical spring coupled to the first end of the housing;

a second vertical spring coupled to the second end of the housing; and a longitudinal spring coupled to the second end of the housing, wherein the first vertical spring and the second vertical spring are each compressed against an interior surface of the wall to generate a vertical biasing force that biases the lip toward the exterior surface of the wall, wherein the longitudinal spring is compressed against a portion of the first tube to generate a longitudinal biasing force that biases the housing toward the first end of the opening, wherein the first vertical spring, the second vertical spring, and the longitudinal spring are each coupled to the housing using one or more fasteners, and wherein at least one of the one or more fasteners is used to couple both the second vertical spring and the longitudinal spring to the housing.

23. The bicycle of claim 22, wherein the lip is directly engaged with the exterior surface of the wall through contact between the lip and the exterior surface of the wall.

24. The bicycle of claim 22, wherein the lip is indirectly engaged with the exterior surface of the wall through a gasket.

25. The bicycle of claim 22, wherein the longitudinal spring is compressed against the second end of the opening, and wherein the longitudinal spring comprises a lip positioned in contact with the exterior surface of the wall.

26. The bicycle of claim 22, wherein the longitudinal spring, the first vertical spring, and the second vertical spring each comprises sheet metal.

* * * * *